United States Patent
Yamamoto et al.

[11] Patent Number: 5,180,685
[45] Date of Patent: Jan. 19, 1993

[54] METHOD FOR THE PRODUCTION OF A SEMICONDUCTOR LASER DEVICE

[75] Inventors: Osamu Yamamoto, Nara; Hidenori Kawanishi, Tsukuba, both of Japan

[73] Assignee: Sharp Kabushiki Kaisha, Osaka, Japan

[21] Appl. No.: 678,834

[22] Filed: Apr. 2, 1991

[30] Foreign Application Priority Data

Apr. 2, 1990 [JP] Japan .................. 2-87714

[51] Int. Cl.⁵ .......................................... H01L 21/20
[52] U.S. Cl. .................................. 437/129; 437/130; 437/133; 148/DIG. 72; 148/DIG. 95
[58] Field of Search ................. 437/129, 130, 133; 148/DIG. 72, DIG. 95; 372/49

[56] References Cited

U.S. PATENT DOCUMENTS

| | | | |
|---|---|---|---|
| 4,751,708 | 6/1988 | Jackson et al. | 372/49 |
| 4,769,342 | 9/1988 | Yagi et al. | 437/129 |
| 5,022,037 | 6/1991 | Kawanishi et al. | 372/49 |

FOREIGN PATENT DOCUMENTS

| | | | |
|---|---|---|---|
| 27474 | 7/1980 | Japan | 372/49 |
| 66688 | 4/1982 | Japan | 437/129 |
| 170585 | 10/1982 | Japan | 372/49 |
| 44787 | 3/1983 | Japan | 372/49 |
| 121989 | 7/1984 | Japan | 372/49 |
| 181082 | 10/1984 | Japan | 437/129 |
| 3182 | 1/1985 | Japan | 437/129 |
| 113983 | 6/1985 | Japan | 372/49 |

OTHER PUBLICATIONS

Patent Abstracts of Japan ( Aug. 26, 1986) 10(248):(E-431).
Nobuhara et al., *Electronics Letters* (Aug. 15, 1985) 21(17):718-719.
Patent Abstracts of Japan (Dec. 7, 1988) 13(548):(E-856).
Patent Abstracts of Japan (May 25, 1989) 13(226):(E-763).
Patent Abstracts of Japan (Apr. 7, 1988) 12(108):(E-579).
Patent Abstracts of Japan *(May 31, 1988) 12(187):(E-615).*
Patent Abstract of Japan (Apr. 14, 1987) 11(119):(E-499).
Patent Abstracts of Japan ( Apr. 14, 1987) 11(119):(E-499).
Patent Abstracts of Japan (Apr. 18, 1985) 9(89):(E-309).

*Primary Examiner*—Brian E. Hearn
*Assistant Examiner*—Linda J. Fleck
*Attorney, Agent, or Firm*—Morrison & Foerster

[57] ABSTRACT

There is provided a method for the production of a semiconductor laser device which emits laser light from an end facet thereof. This method comprises the steps of: forming a multi-layered structure including an active layer for laser oscillation on a semiconductor substrate; etching the semiconductor substrate and the multi-layered structure to form a pluralilty of striped grooves parallel to each other in such a manner that a plurality of projections are formed on the side face of the multi-layered structure in the striped grooves; separating the projections from the multi-layered structure to form a pair of cleavage planes each functioning as a resonator facet; forming a large-band-gap layer on at least one of the cleavage planes on the light-emitting side, the large-band-gap layer having a larger band gap than that of the active layer; forming a reflecting film on the large-band-gap layer; and finally cleaving the semiconductor substrate and the multi-layered structure to obtain a plurality of semiconductor laser devices.

6 Claims, 5 Drawing Sheets

FIG. 3
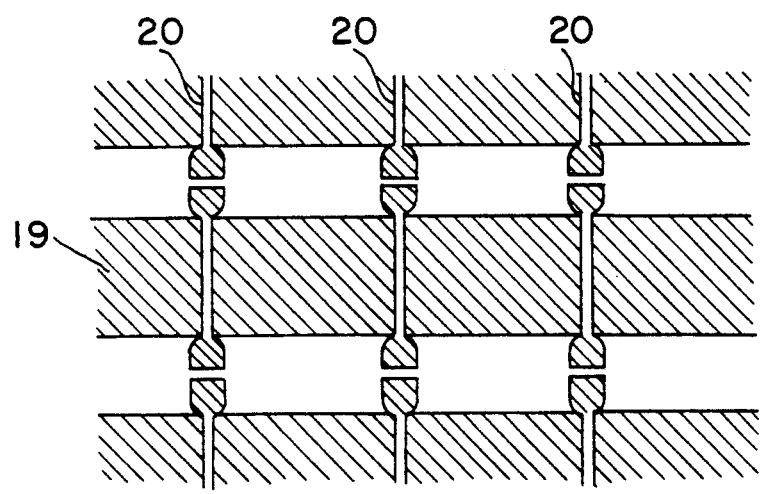
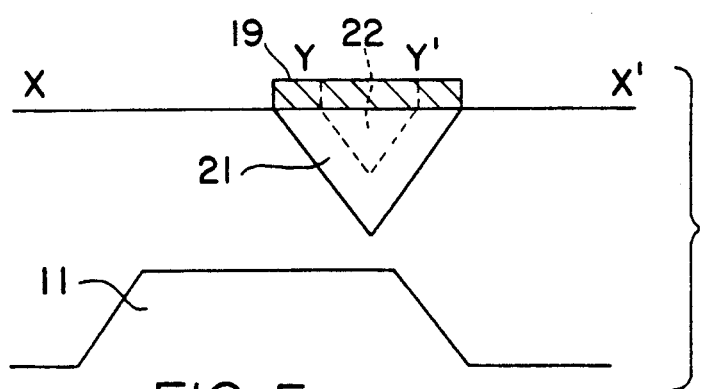
FIG. 5

METHOD FOR THE PRODUCTION OF A SEMICONDUCTOR LASER DEVICE

BACKGROUND OF THE INVENTION

1. Field of the Invention

This invention relates to a method for the production of a semiconductor laser device which emits laser light from an end facet thereof, and more particularly, it relates to an improved method for the production of such a semiconductor laser device which can attain high reliability even when operated at a high output power level for a long period of time.

2. Description of the Prior Art

A semiconductor laser device which emits laser light from an end facet thereof is a typical example of the semiconductor devices produced by use of the cleavage of semiconductor crystals. A semiconductor laser device of this type has a Fabry-Perot resonator having a pair of semiconductor facets and functioning on the basis of the difference in refractive index between the semiconductor crystals and the air outside the device.

In recent years, semiconductor laser devices such as described above have widely come into practical use as light sources for optical disc driving units and the like. When semiconductor laser devices are used as the light sources for write-once optical disc driving units or rewritable optical disc driving units, they are required to have high reliability even at a high output power level of about 40 to 50 mW. Furthermore, for the purpose of attaining higher operational speed of an entire system including an optical disc driving unit, there is a demand for semiconductor laser devices which can attain laser oscillation at a still higher output power level. When semiconductor laser devices are used as the light sources for high-resolution laser printers or for optical pumping of solid state laser devices such as a YAG laser, they are required to attain laser oscillation at an output power level of 100 mW or more.

The high output power operation of such a semiconductor laser device, however, causes the deterioration of its end facet from which laser light is emitted. The deterioration in the light-emitting facet increases the current required for driving the semiconductor laser device, and eventually it becomes impossible for the laser device to attain laser oscillation. Therefore, with respect to semiconductor laser devices, it is difficult to attain high reliability at a high output power level.

The principal cause for the deterioration of the light-emitting facet is now described. First, heat is generated locally at the light-emitting facet due to the high optical density at this facet and also due to non-radiative recombination caused by the surface state. As the temperature in the area near the facet increases, the band gap in that area becomes smaller, which in turn increases the absorption of light. The increase in the light absorption generates carriers, which are then trapped in the surface state, and non-radiative recombination of the carriers occurs. This further generates heat in the area near the light-emitting facet. This process is repeated until the temperature in the area near the facet reaches the melting point of the semiconductor, resulting in facet breakdown.

For the prevention of such deterioration in the light-emitting facet, a semiconductor layer having a large band gap, i.e., a large-band-gap layer, may be formed on the facet. For example, it has been devised to form a semiconductor layer having a larger band gap than the energy of laser light emitted (see Japanese Patent Publication No. 55-27474).

The inventors have proposed the formation of a graded-band-gap layer on at least one of the cleavage planes of semiconductor crystals, which function as a pair of resonator facets (see Japanese patent application No. 1-60422, which corresponds to U.S. patent application Ser. No. 07/489,180). The graded-band-gap layer has a band gap which increases gradually with an increase in the distance from the cleavage plane. Thus, the carriers generated in the vicinity of the light-emitting facet are drawn strongly into the inside of semiconductor crystals due to the drift caused by the grading of the band gap, as well as the migration usually caused by the diffusion. This greatly reduces the probability that the carriers will be trapped in the surface state near the light-emitting facet. Furthermore, because the band gap of the graded-band-gap layer is larger than that of the laser oscillating region including the active layer, the absorption of light in the vicinity of the light-emitting facet is reduced. As a result, facet deterioration can be prevented, allowing the semiconductor laser device to attain stable oscillation at a high output power level.

FIGS. 6a to 6c show a conventional process for producing a semiconductor laser device of the above-mentioned type having a large-band-gap layer (e.g., graded-band-gap layer). The following will describe the conventional process for producing a GaAs or GaAlAs semiconductor laser device of this type, which emits laser light from an end facet thereof.

First, as shown in FIG. 6a, on a substrate 111 made of, for example, GaAs, a multi-layered structure 113 including a GaAs or GaAlAs active layer 112 is grown by a known method such as liquid phase epitaxy or vapor phase epitaxy. Then, the wafer thus obtained is cleaved by a known cleavage method so as to obtain a prescribed cavity length, resulting in a plurality of laser bars 115 as shown in FIG. 6b. At this time, cleavage planes 114, which function as a pair of resonator facets, can be obtained.

After cleaving, as shown in FIG. 6c, an SiO$_2$ film 116 is formed on the planes of the laser bar 115 other than the cleavage planes 114 by plasma chemical vapor deposition or the like. Then, on the cleavage planes 114, a GaAlAs large-band-gap layer (e.g., GaAlAs graded-band-gap layer) is formed by vapor deposition such as molecular beam epitaxy or metal organic chemical vapor deposition. The GaAlAs polycrystals which have been grown on the SiO$_2$ film 116 are removed by etching, followed by removal of the SiO$_2$ film 116.

Next, metal electrodes are deposited on the upper face of the multi-layered structure 113 and the lower face of the substrate 111, respectively. Then, a reflecting film of low reflectivity is formed on the light-emitting facet, and a reflecting film of high reflectivity is formed on the other facet. Finally, the laser bar 115 is cleaved to form a plurality of semiconductor laser devices.

In the above-described conventional process, however, the wafer composed of the substrate and the multi-layered structure is first cleaved to form cleavage planes, resulting in a plurality of laser bars. Thereafter, the large-band-gap (e.g., graded-band-gap layer) and the reflecting films are formed on each of the laser bars. Thus, the step of forming these layers and films must be performed for each of the laser bars, so that the production process becomes complicated. The complicated production process makes it difficult to attain a stable production of semiconductor laser devices with high quality. Furthermore, since semiconductor laser devices are obtained by the cleavage of each laser bar, only a small number of the semiconductor laser devices can be obtained by a single cleavage step, which reduces the productivity.

SUMMARY OF THE INVENTION

The method for the production of a semiconductor laser device according to the present invention, which overcomes the above-discussed and numerous other disadvantages and deficiencies of the prior art, comprises the steps of: forming a multi-layered structure including an active layer for laser oscillation on a semiconductor substrate; etching the semiconductor substrate and the multi-layered structure to form a plurality of striped grooves parallel to each other in such a manner that a plurality of projections are formed on the side face of the multi-layered structure in the striped grooves; separating the projections from the multi-layered structure to form a pair of cleavage planes each functioning as a resonator facet; forming a large-band-gap layer on at least one of the cleavage planes on the light-emitting side, the large-band-gap layer having a larger band gap than that of the active layer; forming a reflecting film on the large-band-gap layer; and finally cleaving the semiconductor substrate and the multi-layered structure to obtain a plurality of semiconductor laser devices.

In a preferred embodiment, the aforementioned large-band-gap layer is formed by a technique selected from the group consisting of metal organic chemical vapor deposition or molecular beam epitaxy.

In a preferred embodiment, the aforementioned large-band-gap layer has a band gap increasing gradually with an increase in the distance from the cleavage plane.

In a preferred embodiment, the aforementioned projections are formed by a technique selected from the group consisting of ion milling and selective etching.

In a preferred embodiment, the aforementioned projections have a triangular cross section.

In a preferred embodiment, the aforementioned projections are separated by application of force in an atmosphere with substantially no oxygen.

Thus, the invention described herein makes possible the objectives of (1) providing a method for the production of a semiconductor laser device having a large-band-gap layer (e.g., graded-band-gap layer) formed on at least the light-emitting facet, so that it can attain high reliability even when operated at a high output power level for a long period of time; and (2) providing a method for the production of such a semiconductor laser device with high productivity, in which the large-band-gap layer and the reflecting film are deposited on at least one of the cleavage planes formed without separating the wafer into laser bars, whereby the production steps can be simplified and the quality of the resulting semiconductor laser devices can be significantly improved.

BRIEF DESCRIPTION OF THE DRAWINGS

The present invention may be better understood and its numerous objectives and advantages will become apparent to those skilled in the art by reference to the accompanying drawings as follows:

FIG. 3 is a plan view showing the pattern of an $SiO_2$ film formed on the upper face of the multi-layered structure.

FIG. 5 is a schematic diagram showing the cross sections along lines X-X' and Y-Y' of FIG. 4.

DESCRIPTION OF THE PREFERRED EMBODIMENTS

In the method for the production of a semiconductor laser device according to the present invention, a pair of cleavage planes are obtained by etching a wafer having a multi-layered structure on a semiconductor substrate to form a plurality of striped grooves parallel to each other in such a manner that a plurality of projections are formed on the side face of the multi-layered structure in the striped grooves, and then separating the projections from the multi-layered structure. The large-band-gap layer (e.g., graded-band-gap layer) and the reflecting film are deposited on at least one of the cleavage planes thus formed without separating the wafer into laser bars. This feature makes it possible to increase the productivity of a semiconductor laser device which can attain high reliability even when operated at a high output power level for a long period of time.

The present invention will be further illustrated by reference to the following examples, but these examples are not intended to restrict the present invention.

EXAMPLES

Figure 1:
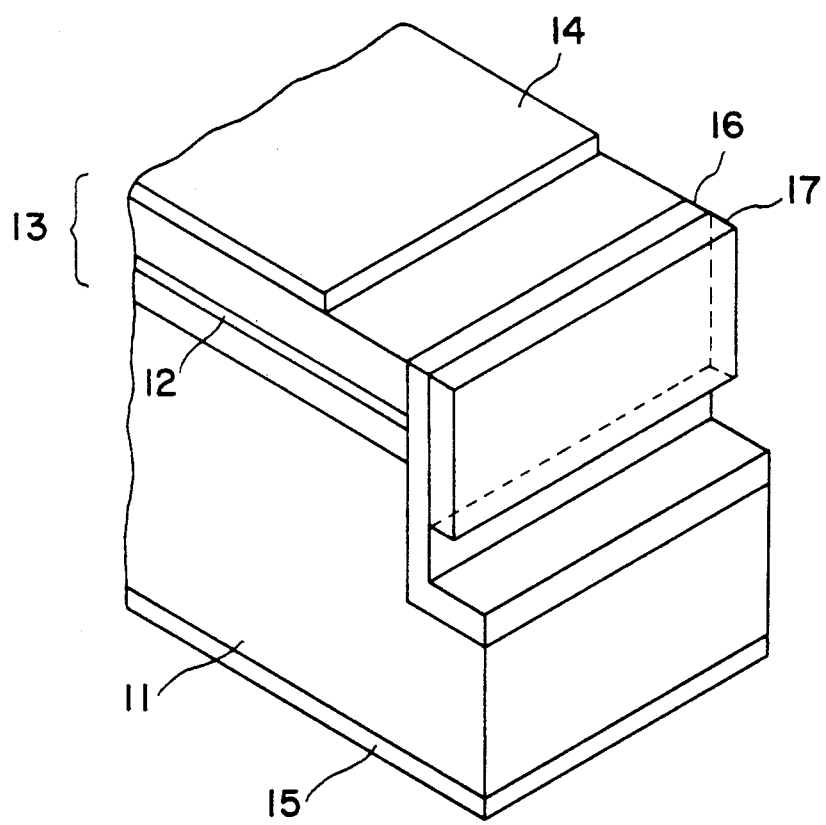
FIG. 1 is a perspective view showing the front facet face of a semiconductor laser device produced by a method of the present invention.

FIG. 1 shows the front facet area of a semiconductor laser device which emits laser light from an end facet thereof. The semiconductor laser device was produced as follows.

First, on a GaAs substrate 11, a multi-layered structure 13 including a GaAs or GaAlAs active layer 12 was grown by a known method such as liquid phase epitaxy or vapor phase epitaxy. Then, on the surface of the multi-layered structure 13, an $SiO_2$ film 19 was formed by plasma chemical vapor deposition. The entire surface of the $SiO_2$ film 19 was coated with a photoresist which was then formed into a prescribed resist pattern by photolithography. Using the resist pattern as a mask, the $SiO_2$ film 19 was etched into a pattern shown by the hatched areas in FIG. 3. The reference numeral 20 in this figure designates a portion which will become a laser oscillation area of the semiconductor laser device to be produced.

Figure 4:
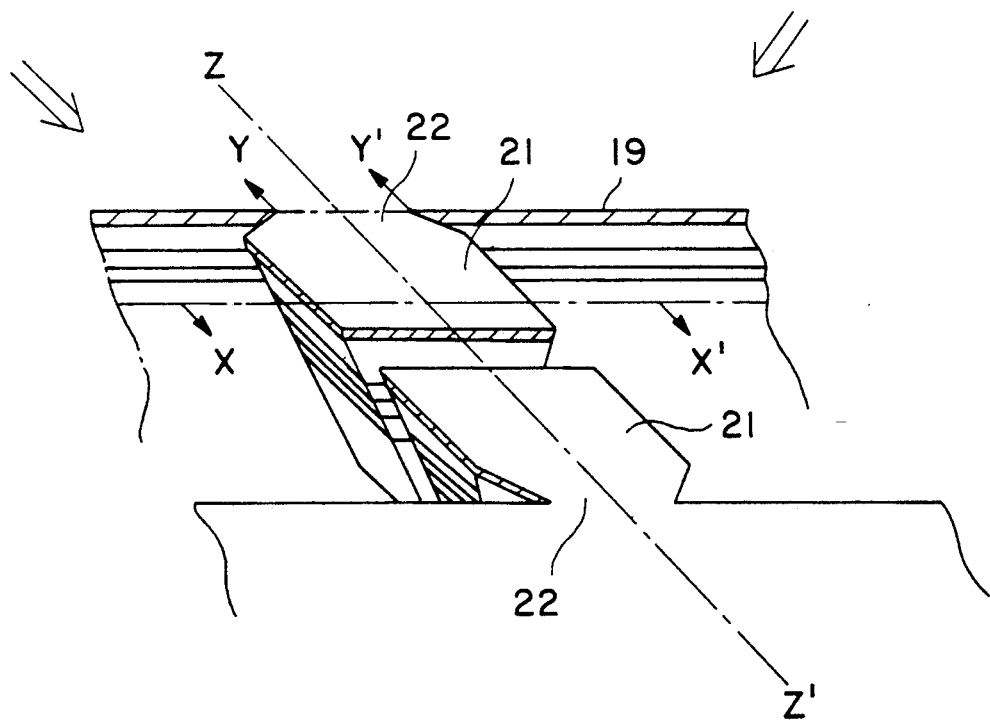
FIG. 4 is a perspective view showing the projections formed on the side face of the multi-layered structure by an ion-milling technique.
Figure 6A:
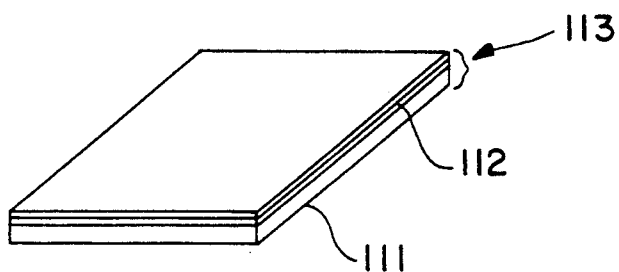
FIGS. 6a to 6c are perspective views showing the conventional process for producing a semiconductor laser device.
Figure 6B:
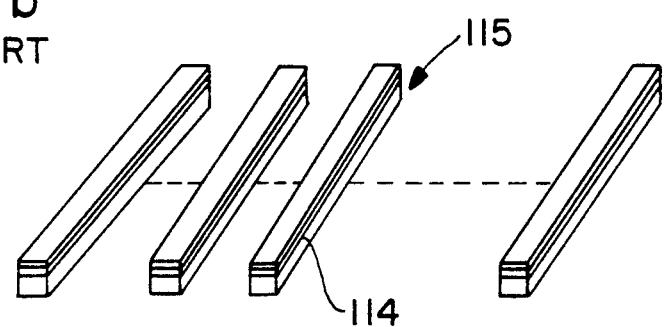
Figure 6C:
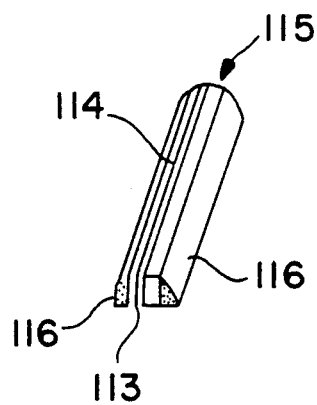

Next, using an ion-milling technique, the substrate 11 and the multi-layered structure 13 were etched from oblique directions, as shown by the thick arrows in FIG. 4, to form a plurality of striped grooves in such a manner that a plurality of projections 21 were formed on the side face of the multi-layered structure 13 in the respective striped grooves.

Figure 2A:
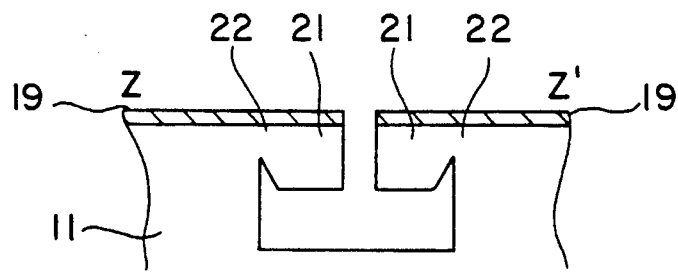
FIGS. 2a to 2e are sectional views showing the production of the semiconductor laser device of FIG. 1.

FIGS. 2a to 2e show the subsequent steps for the production of the semiconductor laser device. In these figures, the boundary lines for specifying the multi-layered structure 13 are omitted for simplicity. FIG. 2a shows a cross section of the projections 21 along line Z-Z' of FIG. 4. FIG. 5 shows cross sections of the projections 21 along lines X-X' and Y-Y' of FIG. 4. Since the etching for the formation of the projections 21 was performed from oblique directions as described above, each of the projections 21 had a triangular cross section. As can be seen from FIG. 2a, each of the projections 21 was connected to the substrate 11 and the multi-layered structure 13 only through a linking section 22, and the bottom of each of the projections 21 was separated from the substrate 11. The linking section 22 also had a triangular cross section which was smaller than that of each of the projections 21.

Figure 2B:
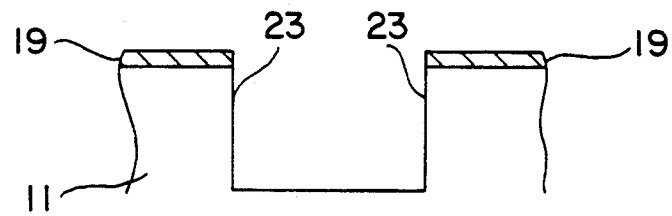

The wafer including the substrate 11 and the multi-layered structure 13 with the projections 21 formed on the side face thereof was then placed in a vapor deposition apparatus such as one used for metal organic chemical vapor deposition or molecular beam epitaxy, followed by cleavage. The cleavage step was performed in a vacuum or in an atmosphere with substantially no oxygen, e.g., in an atmosphere of nitrogen or hydrogen. In this cleavage step, since the linking sections 22 were smaller than the projections 21 in cross section, the application of only a slight force was required for separating the projections 21 from the multi-layered structure 13 by cleavage at the linking sections 22. As a result, a striped groove having a rectangular cross section was formed in the substrate 11 and the multi-layered structure 13, as shown in FIG. 2b. The cleavage planes 23 obtained in this step became resonator facets. For the formation of the projections 21, a selective etching technique (see, e.g., Appl. Phys. Lett., 40, 289 (1982)) can also be used.

Figure 2C:
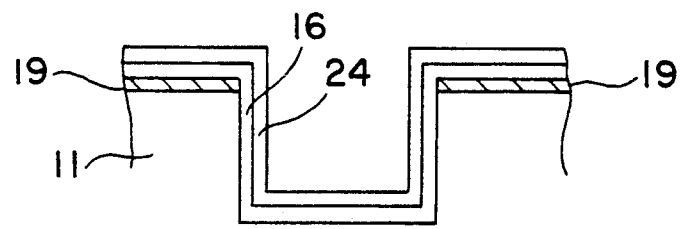
Figure 2D:
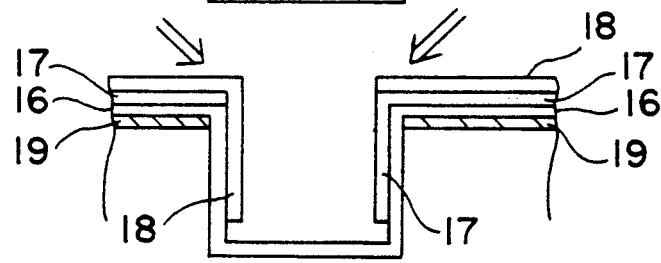

Thereafter, using an apparatus such as one used for metal organic chemical vapor deposition or molecular beam epitaxy, a graded-band-gap layer 16 of $Ga_{1-x}Al_xAs$ was formed on the bottom and the side face of the striped groove, as shown in FIG. 2c. A GaAs protective film 24 was formed thereon so as to prevent the graded-band-gap layer 16 from being oxidized.

The graded-band-gap layer 16 had an Al mole fraction x increasing gradually with an increase in the distance from the surface of the cleavage plane 23, the smallest Al mole fraction being equal to that of the active layer 12. For example, in the production of a semiconductor laser device for emitting laser light with a wavelength of about 780 nm, the Al mole fraction x of the graded-band-gap layer 16 was set to gradually increase from 0.14 to 0.5. The Al mole fraction x of the graded-band-gap layer 16 is not limited to this range, so long as it increases gradually with an increase in the distance from the cleavage plane 23. The Al mole fraction x may increase linearly or parabolically. Furthermore, there may exist a step of the Al mole fraction at the cleavage plane 23 between the graded-band-gap layer 16 and the active layer 12. The thickness of the graded-band-gap layer 16 was set to be about 0.1 $\mu$m.

In the case of metal organic chemical vapor deposition, the graded-band-gap layer 16 can be formed on both the cleavage planes 23 facing each other, as shown in FIG. 2c. In the case of molecular beam epitaxy, the graded-band-gap layer 16 can also be formed on both the cleavage planes 23 by applying molecular beams to the wafer in directions inclined from the direction perpendicular to the upper face of the wafer, while rotating the wafer.

The GaAs protective layer 24 was removed by heat etching or sputtering. Using an electron-beam deposition apparatus, a reflecting film 17 made of $Al_2O_3$ having low reflectivity and a reflecting film 18 made of $Al_2O_3$ and $\alpha$-Si having high reflectivity were successively formed on the graded-band-gap layer 16 by deposition in directions inclined from the direction perpendicular to the wafer, as shown by thick arrows in FIG. 2d. The reflecting films 17 and 18 can also be formed by sputtering.

Since the graded-band-gap layer 16 and the reflecting films 17 and 18, formed on the $SiO_2$ film 19 as described above, were not made of single crystals but made of polycrystals, these layers and films were selectively removed by a known etching process.

In this way, the reflecting film 17 having low reflectivity was formed on the light-emitting facet, and the reflecting film 18 having high reflectivity was formed on the other facet.

Figure 2E:
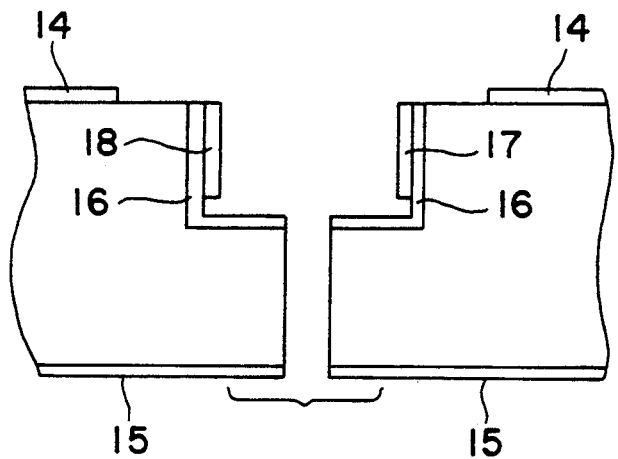

Thereafter, the $SiO_2$ film 19 was removed from the wafer, followed by the formation of electrodes 14 and 15 on the upper face of the multi-layered structure 13 and on the bottom face of the substrate 11, respectively, using a known method. Finally, the wafer was cleaved as shown in FIG. 2e, resulting in a plurality of semiconductor laser devices.

The resulting semiconductor laser devices were able to attain stable laser oscillation at a high output power level for a long period of time, indicating that these semiconductor laser devices had extremely high reliability.

In the above example, the semiconductor laser devices having the graded-band-gap layers formed on the resonator facets were produced. The semiconductor laser devices which can be produced by the method of the present invention are not limited thereto, so long as a large-band-gap layer having a larger band gap than that of the active layer is formed on the resonator facet of the light-emitting side. For example, when a large-band-gap layer made of $Ga_{1-x}Al_xAs$ having a constant Al mole fraction (e.g., $Ga_{0.5}Al_{0.5}As$) is formed on the light-emitting facet, the resulting semiconductor laser devices can also attain high reliability even when operated at a high output power level for a long period of time.

It is understood that various other modifications will be apparent to and can readily be made by those skilled in the art without departing from the scope and spirit of this invention. Accordingly, it is not intended that the scope of the claims appended hereto be limited to the descriptions set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of a semiconductor laser device which emits laser light from an end facet thereof, comprising the steps of:
   forming a multi-layered structure including an active layer for laser oscillation on a semiconductor substrate;
   etching the semiconductor substrate and the multi-layered structure to form a plurality of striped grooves parallel to each other in such a manner that a plurality of projections are formed on the side face of the multi-layered structure in the striped grooves;

separating the projections from the multi-layered structure to form a pair of cleavage planes each functioning as a resonator facet;

forming a large-band-gap layer on at least one of the cleavage planes on the light-emitting side, the large-band-gap layer having a larger band gap than that of the active layer;

forming a reflecting film on the large-band-gap layer; and finally cleaving the semiconductor substrate and the multi-layered structure to obtain a plurality of semiconductor laser devices.

2. A method according to claim 1, wherein the large-band-gap layer is formed by a technique selected from the group consisting of metal organic chemical vapor deposition or molecular beam epitaxy.

3. A method according to claim 1, wherein the large-band-gap layer has a band gap increasing gradually with an increase in the distance from the cleavage plane.

4. A method according to claim 1, wherein the projections are formed by a technique selected from the group consisting of ion milling and selective etching.

5. A method according to claim 1, wherein the projections have a triangular cross section.

6. A method according to claim 1, wherein the projections are separated by application of force in an atmosphere with substantially no oxygen.

* * * * *